United States Patent
Han et al.

(10) Patent No.: US 7,630,236 B2
(45) Date of Patent: *Dec. 8, 2009

(54) FLASH MEMORY PROGRAMMING TO REDUCE PROGRAM DISTURB

(75) Inventors: Jin-Man Han, Santa Clara, CA (US); Benjamin Louie, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 266 days.

This patent is subject to a terminal disclaimer.

(21) Appl. No.: 11/675,151

(22) Filed: Feb. 15, 2007

(65) Prior Publication Data

US 2007/0133294 A1 Jun. 14, 2007

Related U.S. Application Data

(63) Continuation of application No. 11/115,681, filed on Apr. 27, 2005, now Pat. No. 7,196,930.

(51) Int. Cl.
*G11C 11/34* (2006.01)

(52) U.S. Cl. .................. 365/185.02; 365/185.11; 365/185.17; 365/185.18

(58) Field of Classification Search ............ 365/185.02, 365/185.17, 185.19, 185.11, 185.18
See application file for complete search history.

(56) References Cited

U.S. PATENT DOCUMENTS

| | | | |
|---|---|---|---|
| 5,477,499 A | 12/1995 | Van Buskirk et al. | |
| 5,706,228 A | 1/1998 | Chang | |
| 5,870,334 A * | 2/1999 | Hemink et al. | 365/185.17 |
| 5,912,489 A * | 6/1999 | Chen et al. | 257/321 |
| 6,044,017 A | 3/2000 | Lee et al. | |
| 6,151,249 A * | 11/2000 | Shirota et al. | 365/185.17 |
| 6,285,587 B1 | 9/2001 | Kwon | |
| 6,469,933 B2 | 10/2002 | Choi | |
| 6,512,700 B1 | 1/2003 | McPartland | |
| 6,584,016 B2 | 6/2003 | Park | |
| 6,660,585 B1 | 12/2003 | Lee | |
| 6,759,290 B2 | 7/2004 | Ogura | |
| 6,845,042 B2 * | 1/2005 | Ichige et al. | 365/185.17 |
| 6,859,394 B2 * | 2/2005 | Matsunaga et al. | 365/185.17 |
| 7,061,042 B2 * | 6/2006 | Lee et al. | 257/315 |
| 7,161,833 B2 * | 1/2007 | Hemink | 365/185.18 |
| 7,440,321 B2 * | 10/2008 | Aritome | 365/185.17 |

* cited by examiner

*Primary Examiner*—Anh Phung
*Assistant Examiner*—Alexander Sofocleous
(74) *Attorney, Agent, or Firm*—Leffert Jay & Polglaze, P.A.

(57) ABSTRACT

The method for reducing program disturb in a flash memory array biases a selected wordline at a programming voltage. One of the unselected wordlines, closer to array ground than the selected wordline, is biased at a voltage that is less than $V_{pass}$. The memory cells on this unselected wordline that are biased at this voltage block the gate induced drain leakage from the cells further up in the array. The remaining unselected wordlines are biased at $V_{pass}$. In another embodiment, a second source select gate line is added to the array. The source select gate line that is closest to the wordlines is biased at the voltage that is less than $V_{pass}$ in order to block the gate induced drain leakage from the array.

11 Claims, 4 Drawing Sheets ized to begin at the wordline closest to the source select gate and continue up to the wordline closest to the drain select gate. However, the present invention is not limited to any one programming scheme.

FLASH MEMORY PROGRAMMING TO REDUCE PROGRAM DISTURB

RELATED APPLICATION

This application is a Continuation of U.S. application Ser. No. 11/115,681, titled "FLASH MEMORY PROGRAMMING TO REDUCE PROGRAM DISTURB," filed Apr. 27, 2005, now U.S. Pat. No. 7,196,930, which is commonly assigned and incorporated herein by reference.

TECHNICAL FIELD OF THE INVENTION

The present invention relates generally to memory devices and in particular the present invention relates to flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance of electronic systems employing flash memory devices increases, flash memory device performance should also increase. A performance increase includes reducing power consumption, increasing speed, and increasing the memory density. One way to accomplish these tasks is by decreasing the size of each memory cell.

Unfortunately, there are resulting problems with decreasing the memory cell size. One such problem is that, as the channel length and gate oxide thickness are reduced, leakage current increases. One type of leakage current is gate induced drain leakage (GIDL) that results due to the depletion at the drain surface below the gate-drain overlap region.

GIDL can cause a problem referred to as program disturb during a programming operation. For example, FIG. 1 illustrates a portion of a typical prior art NAND flash memory array. During a program operation to program a memory cell 101, the wordline 102 coupled to that cell 101 is biased with a 20V programming pulse. The bitline 106 coupled to that cell is brought to ground potential. This provides a gate to source potential of 20V across the cell 101 to be programmed.

The other cells on the selected wordline 102 will also have the 20V programming pulse applied. In order to inhibit these cells from being programmed, their bitlines 105 are biased to $V_{CC}$. Additionally, the remaining unselected wordlines are biased with 10V pulses. This biasing creates a channel voltage of approximately 7V on the unselected cell 103. This provides a gate to source voltage of approximately 13V that is below the required programming voltage.

Since the source select gate line is at 0V in order to turn off those select transistors, there is a voltage drop of 7V from drain to gate 110 that can cause the 7V on the unselected cell to leak away, thus creating the possibility that the unselected cell 103 is programmed. This is referred to in the art as program disturb.

For the reasons stated above, and for other reasons stated below which will become apparent to those skilled in the art upon reading and understanding the present specification, there is a need in the art for a way to reduce program disturb in a memory device.

DETAILED DESCRIPTION

Figure 1:
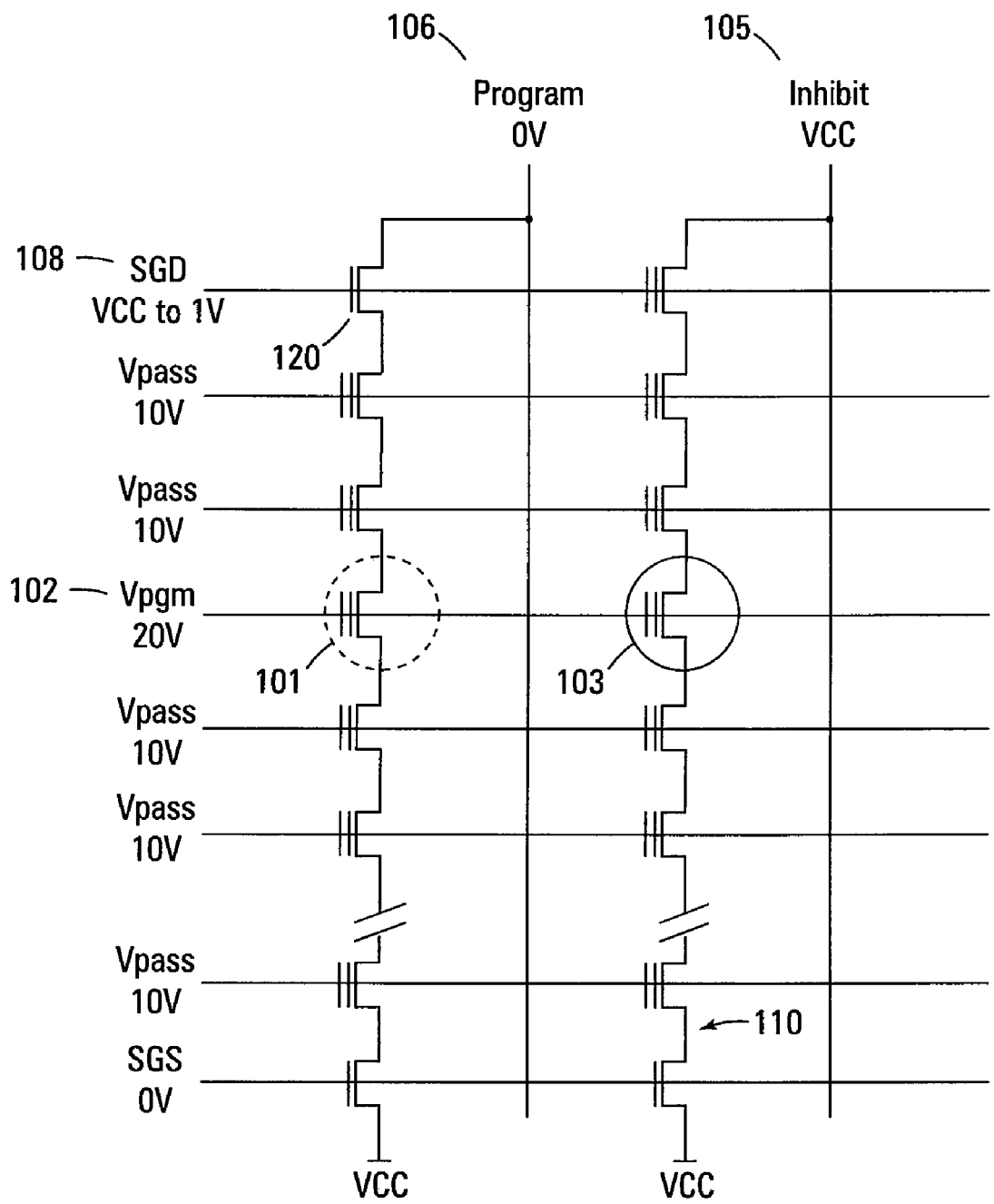
FIG. 1 shows a portion of a typical prior art NAND flash memory array architecture.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
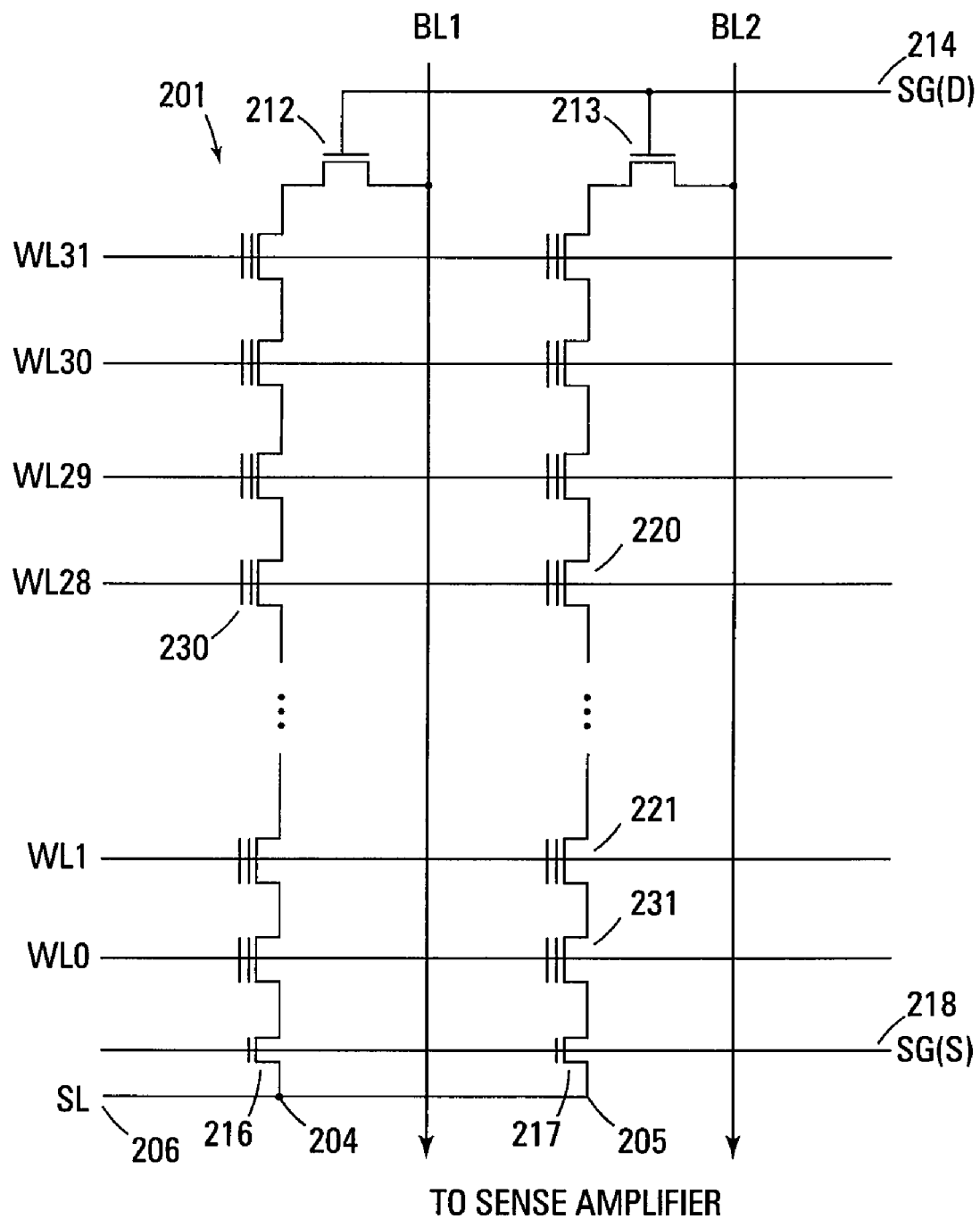
FIG. 2 shows a portion of a NAND flash memory array architecture of the present invention that reduces program disturb.

FIG. 2 illustrates a simplified diagram of one embodiment for a non-volatile memory array of the present invention. The memory array of FIG. 2, for purposes of clarity, does not show all of the elements typically required in a NAND flash memory array. For example, only two bitlines are shown (BL1 and BL2) when the number of bitlines required actually depends upon the memory density. The bitlines are subsequently referred to as (BL1-BLN).

The array is comprised of an array of floating gate cells 201 arranged in series strings 204, 205. Each of the floating gate cells 201 is coupled drain to source in each series chain 204, 205. A word line (WL0-WL31) that spans across multiple series strings 204, 205 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series chain 204, 205 to be written to or read from and operate the remaining floating gate memory cells in each series string 204, 205 in a pass through mode. Each series string 204, 205 of floating gate memory cells is coupled to a source line 206 by a source select gate 216, 217 and to an individual bitline (BL1-BLN) by a drain select gate 212, 213. The source select gates 216, 217 are controlled by a source select gate control line SG(S) 218 coupled to their control gates. The drain select gates 212, 213 are controlled by a drain select gate control line SG(D) 214.

In one embodiment, the wordlines are programmed upward from the lower wordline WL0. Programming is typically accomplished by a series of programming pulses that start at a voltage that is less than 20V and increases by a predetermined step voltage until the cell is programmed or a maximum voltage is reached. In one embodiment, the programming voltages start between 14.4V to 19V and go up to a maximum voltage of 20.6V. Multi-level cells might use a maximum voltage of 21V or greater. Alternate embodiments can use other pulse amplitudes.

The programming operation of the present invention comprises applying a programming pulse to a selected wordline WL28 that is coupled to the cell 230 to be programmed. One or more of the wordlines that are closer to the SG(S) line 218 than WL28 in the array (i.e., WL27-WL0) is biased at a voltage that is less than $V_{pass}$. In one embodiment, the voltage is greater than ground potential. The remaining wordlines are biased at $V_{pass}$. In one embodiment, $V_{pass}$ is 10V. The present invention, however, is not limited to any one $V_{pass}$ voltage.

As an example of one embodiment of a programming operation of the present invention, WL28 is biased at a programming voltage with a programming pulse (e.g., 20V). The last wordline WL0 is biased at a voltage of $V_{CC}$ since this voltage is easy to generate at the wordline. The remaining wordlines WL1-WL27 and WL29-WL31 are biased at $V_{pass}$ (e.g., 10V). The bitline BL1 coupled to the cell 230 to be programmed is at ground potential while the remaining bitlines BL2-BLN are at an inhibit voltage. In one embodiment, this voltage is $V_{CC}$. The SG(D) line is brought to some initial predetermined voltage (e.g., $V_{CC}$) and is then reduced to a second predetermined voltage (e.g., 1V).

In the prior art method of programming, the cells (e.g., 220) adjacent to the cell 230 being programmed would experience program disturb. However, due to the lower voltage on WL0, the 0V on the SG(S) line is blocked from causing GIDL and thus leaking the channel voltage from the cell 220 of BL2. GIDL is greatly reduced between the cell 221 of WL1 and the cell 231 of WL0 since the potential difference between the channel voltage of the upper cell 221 and the gate voltage of the lower cell 231 is now substantially smaller.

The GIDL between the last cell 231 in the bitline BL2 and the select gate 217 is also reduced since the drain voltage at this node, instead of being 0V as in the prior art, is increased to $V_{CC}-V_{th}$ or $V_{CC}+V_{th}$. This is also a substantial reduction in the voltage potential between the cell 231 channel and the select gate transistor 217 gate.

The example illustrated above biases the lowest wordline WL0 of the array with the voltage that is between 0V and $V_{pass}$. However, any wordline that is closer to the SG(S) line in the array than the one with the programming voltage can be biased in this way in order to block GIDL.

Even though FIG. 2 illustrates a memory array configured in a NAND architecture, the present invention is not limited to this configuration. For example, one embodiment might use a NOR configuration. In a NOR configuration, the cells are arranged in a matrix. The gates of each floating gate memory cell of the array matrix are connected by rows to wordlines and their drains are connected to column bitlines. The source of each floating gate memory cell is typically connected to a common source line. Still other embodiments can use other architectures.

In another embodiment of the programming method of the present invention, all of the wordlines WL0-WL27 below the wordline WL28 being programmed are biased at $V_{CC}$ or some other voltage that is less than $V_{pass}$. The remaining wordlines WL29-31 are biased at $V_{pass}$.

In yet another embodiment, the wordline WL27 adjacent to the wordline being programmed WL28, and closest to the SG(S) line, is biased at $V_{pass}$. The remaining wordlines below the adjacent wordline WL27 are biased at $V_{CC}$ or some voltage that is less than $V_{pass}$. The wordlines WL29-WL31 above the programmed wordline WL28 are biased at $V_{pass}$.

Figure 3:
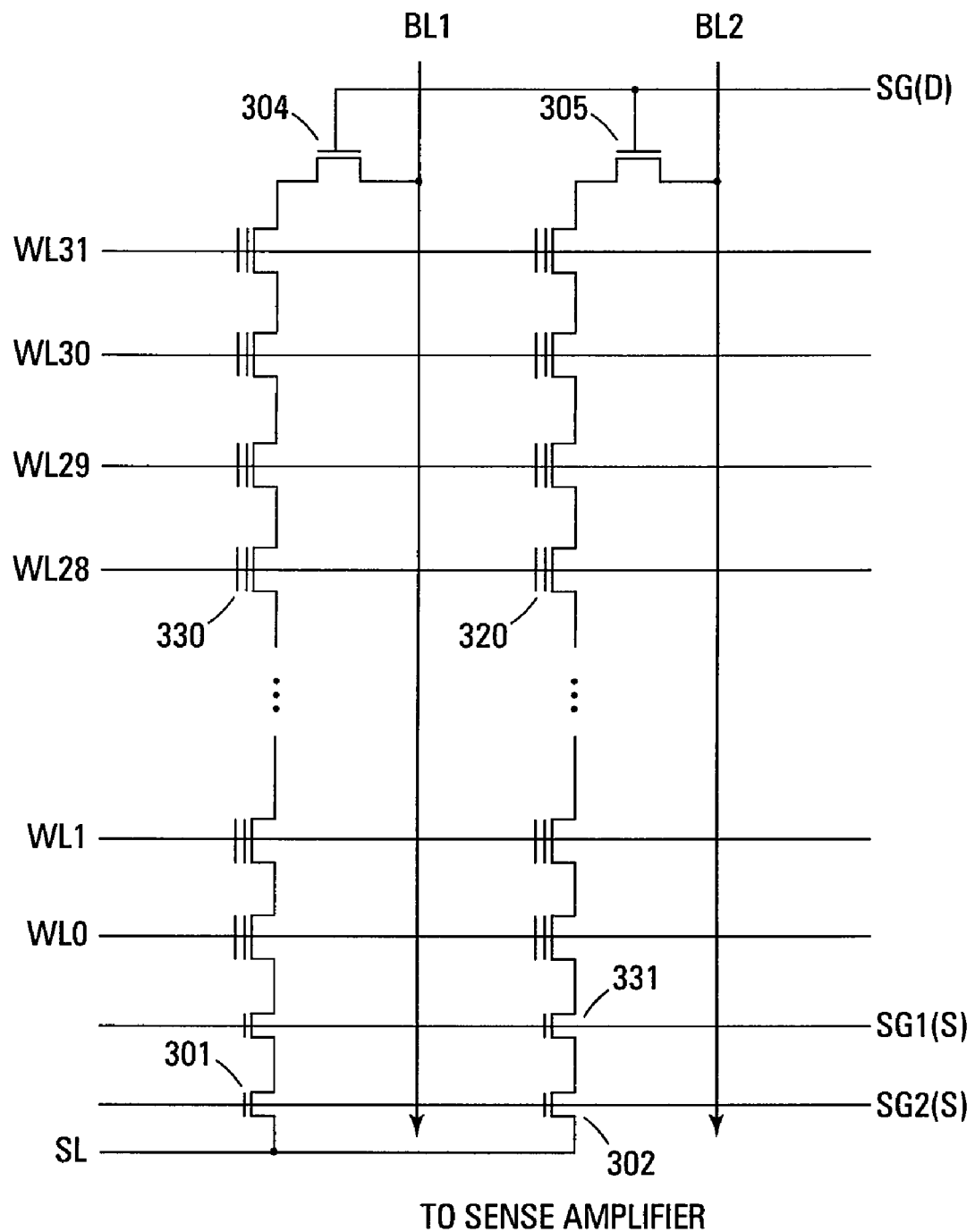
FIG. 3 shows a portion of an alternate embodiment of a NAND flash memory array architecture of the present invention that reduces program disturb.

FIG. 3 illustrates an alternate embodiment for a non-volatile memory array of the present invention. The NAND flash memory array in this embodiment is substantially similar to that of FIG. 2 except for the addition of an extra row 301 of select gate transistors in each of the series strings 304 and 305 of cells.

The method of the FIG. 3 embodiment includes applying a programming pulse (e.g., 20V) to the wordline WL28 comprising the cell 330 to be programmed. The remaining wordlines WL0-WL27 and WL29-WL31 are biased at some $V_{pass}$ voltage. In one embodiment, $V_{pass}$ is 10V. Alternate embodiments may use a series of programming pulses having other voltages.

The bitline BL1 that is coupled to the cell to be programmed is at ground potential. The remaining bitlines BL2-BLN are at an inhibit voltage. In one embodiment, the inhibit voltage is $V_{CC}$. The SG(D) line is initially biased at a first predetermined voltage (e.g., $V_{CC}$). This bias is then reduced to a second predetermined voltage (e.g., 1V).

The lowest source select gate line SG2(S) is biased at 0V or some other voltage that is less than $V_{CC}$. The upper source select gate control line SG1(S) is biased at some voltage that is less than $V_{pass}$. In one embodiment, this voltage is also greater than 0V. In one embodiment, this voltage is $V_{CC}$. Alternate embodiments may use other voltages.

In this embodiment, the cells that are adjacent to the cell being programmed might experience program disturb without the embodiment of the present invention (e.g., cell 320). However, the embodiment of FIG. 3 blocks GIDL during the programming of all 32 rows of memory cells in the array by raising the gate voltage on the upper select transistor 331. Additionally, as in the previous embodiment, GIDL is blocked between the upper select transistor 331 and the lower select transistor 302 since the drain voltage on the lower select transistor 302 is now increased to $V_{CC}-V_{th}$ or $V_{CC}+V_{th}$ instead of the prior art 0V.

Figure 4:
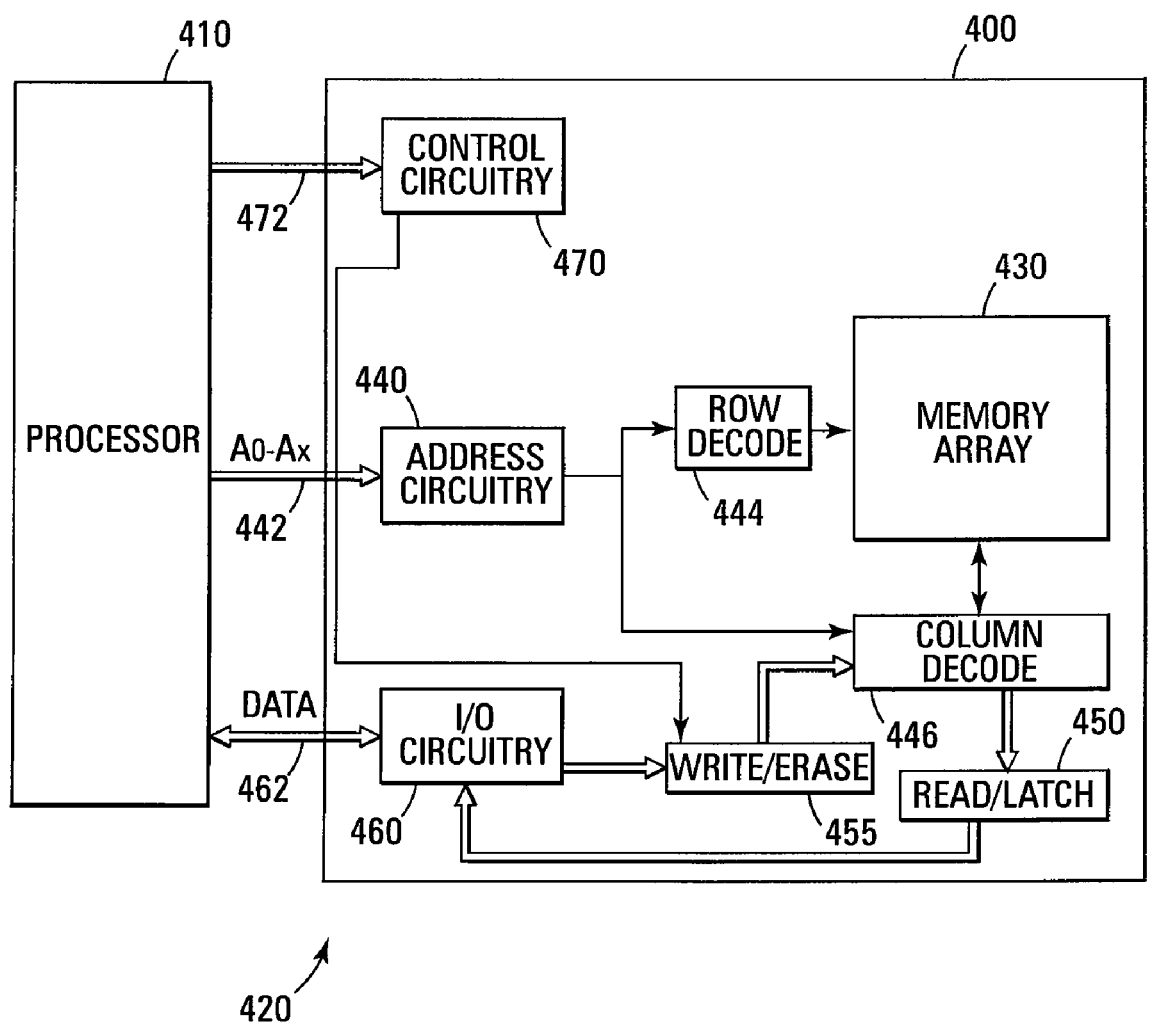
FIG. 4 shows a block diagram of one embodiment of an electronic system of the present invention.

FIG. 4 illustrates a functional block diagram of a memory device 400 that can incorporate the flash memory array and programming method embodiments of the present invention. The memory device 400 is coupled to a processor 410. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device includes an array of flash memory cells 430 as described above with reference to FIGS. 2 and 3. The memory array 430 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture, NOR architecture, or some other architecture.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense/buffer circuitry 450. The sense/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write (program), and erase operations. The control circuitry 470 may be a state machine, a sequencer, or some other type of controller. In one embodiment, the control circuitry 470 is responsible for executing the embodiments of the programming method of the present invention.

The flash memory device illustrated in FIG. 4 has been simplified to facilitate a basic understanding of the features of the memory. A more detailed understanding of internal circuitry and functions of flash memories are known to those skilled in the art.

CONCLUSION

In summary, the embodiments of the present invention provide a way to reduce GIDL and, therefore, program disturb in a flash memory device. By using a wordline voltage that is less than $V_{pass}$ on one of the wordlines that is closer to the source select gate line than the one being programmed, the GIDL can be blocked. In another embodiment, a second row of source select gate transistors is added and the upper row of the select gate transistors is biased with a voltage that is less than $V_{pass}$. Program disturb is reduced in both the wordline and bitline directions.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory device comprising:
   a memory array organized as memory blocks in which each block is comprised of a plurality of word line rows and a plurality of bit line columns, each bit line column comprising a drain select gate transistor and at least one row of source select gate transistors; and
   control circuitry coupled to the memory array and adapted to control programming of the memory array such that the control circuitry controls: the bias of a selected word line of a memory block, coupled to a memory cell to be programmed, with a programming voltage, the bias of unselected word lines of the memory block adjacent to the memory cell to be programmed and between the memory cell to be programmed and the drain select gate transistor with a first voltage, and the bias of remaining unselected word lines with a second voltage that is less than the first voltage and greater than 0V.

2. The device of claim 1 wherein the programming voltage is in a range of 14V to 20V.

3. The device of claim 1 wherein the first voltage is 10V.

4. The device of claim 1 wherein the control circuitry is further adapted to control generation of a series of sequentially incrementing programming pulses having amplitudes in a range of 14V to 21V.

5. The device of claim 1 wherein the control circuitry is further adapted to bias a first bit line coupled to the memory cell to be programmed at ground potential.

6. The device of claim 1 wherein the control circuitry is further adapted to bias each bit line not coupled to the memory cell to be programmed at an inhibit voltage.

7. The device of claim 6 wherein the inhibit voltage is $V_{CC}$.

8. A NAND non-volatile memory device comprising:
   a memory array organized in a NAND configuration and comprising a plurality of memory blocks each block comprising a plurality of rows coupled to word lines, a plurality of columns coupled to bit lines, and a drain select gate transistor and a plurality of source select gate transistors in each column; and
   a memory control circuit coupled to the memory array for controlling operation of the memory array, the memory control circuit adapted to program a selected memory cell of a memory block by controlling: biasing of a selected word line coupled to the selected memory cell with at least one programming pulse having an initial amplitude at a programming voltage and biasing of the unselected word lines adjacent to the selected memory cell and between the selected memory cell and the drain select gate transistor with a first voltage, and biasing of remaining unselected word lines with a second voltage that is less than the first voltage and greater than 0V and the memory control circuit further controls biasing of a first source select gate transistor, of the plurality of source select gate transistors, with a voltage that is less than $V_{pass}$.

9. The device of claim 8 wherein the at least one programming pulse has an amplitude in a range from 14V to 21V that is increased by a step voltage and $V_{pass}$ is 10V.

10. The device of claim 8 wherein the memory control circuit is further adapted to control biasing of a second source select gate transistor with a voltage that is less then $V_{CC}$.

11. The device of claim 10 wherein the second source select gate transistor is closer to a source line of the memory array than the first source select gate transistor.

* * * * *